United States Patent
Sano

Patent Number: 5,828,000
Date of Patent: Oct. 27, 1998

[54] SEMICONDUCTOR DEVICE WITH HEAT RADIATING PLATE AND POSITIONING DUMMY LEAD AND LEAD FRAME THEREFOR

[75] Inventor: Yoshiaki Sano, Kawasaki, Japan

[73] Assignee: Fujitsu Limited, Kanagawa, Japan

[21] Appl. No.: 843,854

[22] Filed: Apr. 17, 1997

[30] Foreign Application Priority Data

Nov. 14, 1996 [JP] Japan .................................. 8-303059

[51] Int. Cl.⁶ .................................................. H01L 23/02
[52] U.S. Cl. .................. 174/52.4; 257/675; 257/676; 257/713; 257/707; 257/695
[58] Field of Search .................................. 257/675, 676, 257/713, 707, 695, 669, 666, 670; 361/718, 723, 714, 709, 710, 711; 174/52.4

[56] References Cited

U.S. PATENT DOCUMENTS 5,309,322  5/1994  Wagner et al. ........................ 361/732
5,661,337  8/1997  Manteghi ............................... 257/676

FOREIGN PATENT DOCUMENTS 57-21829   2/1982  Japan .
63-117453  5/1988  Japan .

*Primary Examiner*—Bot L. Ledynh
*Assistant Examiner*—Hung V. Ngo
*Attorney, Agent, or Firm*—Armstrong, Westerman, Hattori, McLeland & Naughton

[57] ABSTRACT

A semiconductor device including an insulating package outer frame member, outer leads, positioning dummy leads, a heat radiating plate, and a semiconductor chip mounted to the heat radiating plate. The heat radiating plate is made from a different material from that of the outer leads, and the positioning dummy leads act to regulate the position of the heat radiating plate during the soldering process. The positioning dummy leads and the outer leads are made in a common lead frame, and are separated from each other after the soldering process, preferably after the subsequent plating process.

22 Claims, 8 Drawing Sheets

SEMICONDUCTOR DEVICE WITH HEAT RADIATING PLATE AND POSITIONING DUMMY LEAD AND LEAD FRAME THEREFOR

BACKGROUND OF THE INVENTION

1. Field of the Invention

The present invention relates to a semiconductor device and a lead frame therefor. In particular, the present invention relates to a semiconductor device having a heat radiating plate and positioning dummy leads to regulate the position of the heat radiating plate.

2. Description of the Related Art

A semiconductor device includes a ceramic package outer frame member, a heat radiating plate attached to the package outer frame member, a semiconductor chip mounted to the heat radiating plate, and outer leads attached to the package outer frame member. These members are fixed to each other by silver solder.

The ceramic package outer frame member is an insulating member, and has a first metallized pattern used for attaching the outer leads and a second metallized pattern used for attaching the heat radiating plate. The outer leads are put on the first metallized pattern via silver solder and the heat radiating plate is put on the second metallized pattern via silver solder, and these members are soldered together by heating these members so that the outer leads and the heat radiating plate are fixed to the package outer frame member. After the outer leads and the heat radiating plate are fixed to the package outer frame member, these members are plated with nickel and gold, and the semiconductor chip is mounted to the heat radiating plate by die-bonding.

Outer leads are made in the form of a lead frame. Outer leads are made from iron-nickel alloy to endure soldering temperature and to provide a sufficient strength of the outer leads. On the other hand, the heat radiating plate is sometimes made from iron-nickel alloy, or it is made from copper or a copper alloy in other cases.

If the heat radiating plate is made from iron-nickel alloy, it is possible to make the heat radiating plate integral with the outer leads in the lead frame, and it is relatively easy to attach the heat radiating plate and the outer leads to the package outer frame member. However, iron-nickel alloy has a lower thermal conductivity, so it is not well adapted for use as a heat radiating plate in a high-power semiconductor device.

If the heat radiating plate is made from copper or copper alloy, it is a more thermally conductive heat radiating plate. However, the soldering temperature is relatively high, for example, 800° C., and copper or copper alloy becomes softened and cannot provide a sufficient strength. Copper or a copper alloy are thus not well adapted for making the heat radiating plate. Therefore, the heat radiating plate is sometimes made as a separate member from the outer leads. In this case, the heat radiating plate is not fixed to any other member and can freely move during the soldering process, and a problem arise in that the heat radiating plate is attached to the package outer frame member at a displaced position.

In addition, after the heat radiating plate and the outer leads are attached to the package outer frame member, these members are plated. Usually, electrolytic plating is carried out, using the outer leads (lead frame) as an electrode. However, the copper or copper alloy heat radiating plate is not connected to the outer leads, so it is not plated unless a special means is adopted. As a one of such means, the heat radiating plate is connected to the outer leads by a clip or the like before the plating process, and the clip or the like is detached after the plating process.

In order to fix the heat radiating plate to the package outer frame member during the soldering process, several methods can be used. One method uses a carbon tool to position the heat radiating plate relative to the package outer frame member, and another method is to fabricated the heat radiating plate in a special stepped shape. However, in the method using the carbon tool to position the heat radiating plate, the heat radiating plate is not directly secured to the package outer frame member, so the positioning accuracy is low. In the method fabricating the heat radiating plate in a special stepped shape, it is necessary to machine the heat radiating plate into a special shape, so the manufacturing cost increases.

SUMMARY OF THE INVENTION

The object of the present invention is to solve the above described problems and provide a semiconductor device and a lead frame, in which a heat radiating plate can be maintained at an exact position relative to a package outer frame member during a soldering process, and thereafter, it is possible to carry out plating.

According to the present invention, there is provided a semiconductor device comprising an insulating package outer frame member having an annular bottom surface with outer and inner peripheral regions, a first metallized pattern provided at least on the outer peripheral region of the bottom surface, and a second metallized pattern provided on the inner peripheral region of the bottom surface, outer leads connected to the first metallized pattern of the package outer frame member, a heat radiating plate arranged in the same plane as the outer leads and connected to the second metallized pattern of the package outer frame member, at least one positioning dummy lead made from a material different from that of the heat radiating plate and connected to the second metallized pattern of the package outer frame member to regulate the position of the heat radiating plate, and a semiconductor chip mounted to the heat radiating plate within the package outer frame member.

In the above described semiconductor device and the above described lead frame, the at least one positioning dummy lead is provided in the lead frame such that the at least one positioning dummy lead regulates the position of the heat radiating plate while the heat radiating plate is being attached to the package outer frame member. The at least one positioning dummy lead thus regulates the position of the heat radiating plate while the heat radiating plate is being soldered to the package outer frame member, to ensure that the at least one positioning dummy lead is fixed to the package outer frame member in place. Since the at least one positioning dummy lead is connected to the leads (outer leads) of the lead frame, the heat radiating plate is plated when electrolytic plating is carried out, using the outer leads (lead frame) as an electrode.

The at least one positioning dummy lead is cut and separated from the lead frame and a portion of the at least one positioning dummy lead eventually remains within the semiconductor device. However, in this condition, the at least one positioning dummy lead is electrically separated from the leads (outer leads).

According to the present invention, there is also provided a lead frame mounted to a semiconductor device including a package outer frame member, a heat radiating plate and a semiconductor chip. The lead frame comprises an annular rectangular frame having a first pair of frame portions and a second pair of frame portions, outer leads extending inwardly from the first pair of frame portions, and at least one positioning dummy lead extending inwardly from at least one of the second pair of frame portions. Said at least one positioning dummy lead is arranged such that the at least one positioning dummy lead regulates the position of the heat radiating plate while the heat radiating plate is being attached to the package outer frame member and is separated from the at least one of the second pair of frame portions after the heat radiating plate is attached to the package outer frame member.

Preferably, the at least one positioning dummy lead is made from a material identical to that of the outer leads, and arranged in the same plane as that of the outer leads and separated from the outer leads.

Preferably, the outer leads are made from iron-nickel alloy, the heat radiating plate is made from metal selected from the group consisting of copper, copper alloy, tungsten and molybdenum, and the outer leads, the at least one positioning dummy lead and the heat radiating plate are plated by a common plating material.

Preferably, the at least one positioning dummy lead is arranged such that a small clearance exists between the at least one positioning dummy lead and the heat radiating plate.

Preferably, the at least one positioning dummy lead comprises two positioning dummy leads arranged oppositely on either side of the heat radiating plate.

Preferably, one of the two positioning dummy lead a has a different size from the other of the two positioning dummy leads.

Preferably, the two positioning dummy leads are arranged at a distance between them, and the heat radiating plate has a size, the distance between the two positioning dummy leads being slightly greater than the size of the heat radiating plate, whereby a small clearance exists between the respective one positioning dummy lead and the heat radiating plate, the at least one positioning dummy lead comprises two positioning dummy leads arranged oppositely on either side of the heat radiating plate, each of the two positioning dummy leads having a first portion located at the outer peripheral region of the package outer frame member and a second portion facing the heat radiating plate, the second portion being greater than the first portion.

Preferably, the second portion of each of the two positioning dummy leads is longer than a side of the heat radiating plate that faces the second portion and bent around corners of the heat radiating plate.

Preferably, the at least one positioning dummy lead comprises a first pair of positioning dummy leads arranged oppositely on either side of the heat radiating plate along a first line, and a second pair of positioning dummy leads arranged oppositely on either side of the heat radiating plate along a second line perpendicular to the first line.

Preferably, the at least one positioning dummy lead comprises an annular portion surrounding the heat radiating plate, and two linear portions extending from the annular portion toward an outer peripheral region of the heat radiating plate.

Preferably, one of the two linear portions has a different shape from the other of the two linear portions.

Preferably, a groove is provided in a side surface of the package outer frame member, whereby said at least one positioning dummy lead can be cut at a position flush with the side surface of the package outer frame member and the at least one positioning dummy lead can be seen through the groove.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 3:
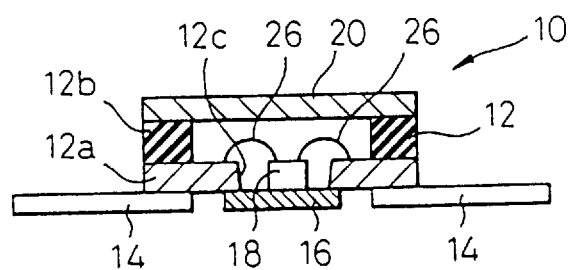
FIG. 3 is a cross-sectional view of a semiconductor device according to the embodiment of the present invention.

FIG. 3 shows a semiconductor device according to an example of the present invention. The semiconductor device 10 comprises a ceramics package outer frame member 12, outer leads 14, a heat radiating plate 16, and a semiconductor chip 18. The package outer frame member 12 has an annular rectangular shape and comprises a lower outer frame member 12a and an upper outer frame member 12b, with a cap 20 attached to the top of the upper outer frame member 12b. The lower outer frame member 12a has a central hole 12c, and the semiconductor chip 18 is arranged within this central hole 12c and attached to the heat radiating plate 16.

Figure 4:
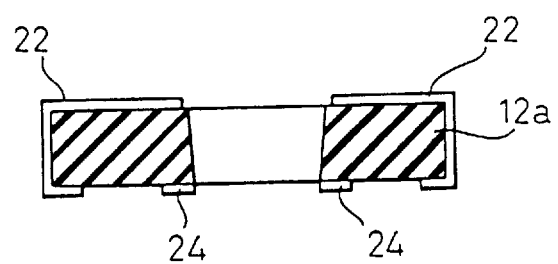
FIG. 4 is cross-sectional view of the upper outer frame member of FIG. 3 with the metallized patterns.

The lower outer frame member 12a has a first metallized pattern 22 formed thereon by printing molybdenum or tungsten, as shown in FIG. 4. The first metallized pattern 22 extends from the portion of the upper surface of the lower outer frame member 12a near the inner periphery thereof, through the outer side surface thereof, to the portion of the lower surface thereof near the outer periphery thereof. In addition, the lower outer frame member 12a has a second metallized pattern 24 formed thereon by printing molybdenum or tungsten. The second metallized pattern 24 is located at the portion of the lower surface of the lower outer frame member 12a near the inner periphery thereof. Also, a third metallized pattern (not shown) extends from the second metallized pattern 24, through the outer side surface of the lower outer frame member 12a and the outer side surface of the upper outer frame member 12b, to the upper surface of the upper outer frame member 12b.

Bonding wires 26 interconnect the semiconductor chip 18 and the first metallized pattern 22, as shown in FIG. 3. The outer leads 14 are located on the bottom portion of the first metallized pattern 22. The heat radiating plate 16 is located on the second metallized pattern 24.

Figure 1:
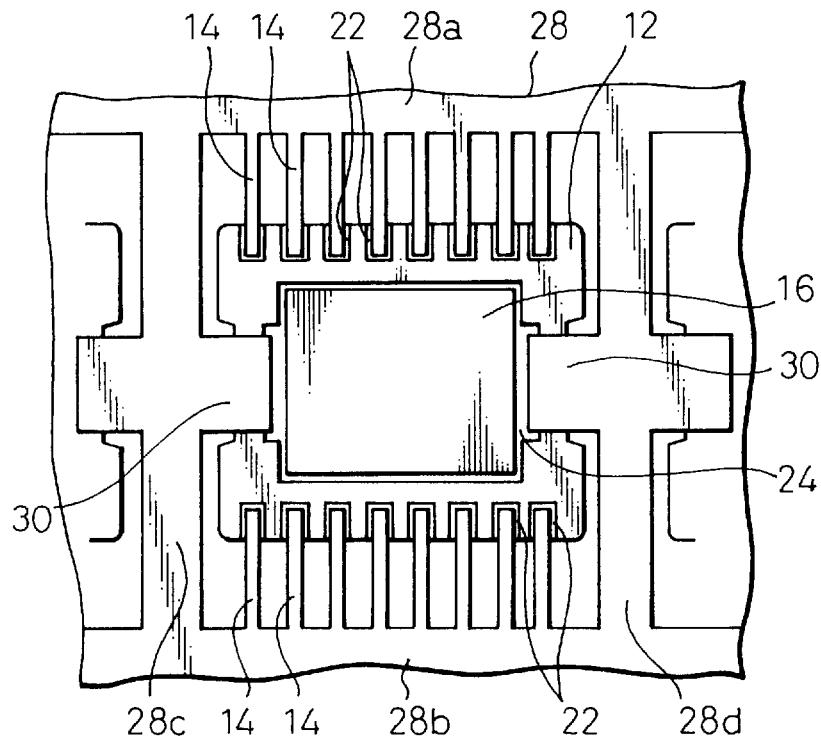
FIG. 1 is a bottom plan view of a semiconductor device and a lead frame according to the embodiment of the present invention.

FIG. 1 shows a lead frame 28 and the heat radiating plate 16 attached to the package outer frame member 12. In FIG. 1, the package outer frame member 12 of FIG. 3 is held in an inverted position by a carbon tool, for example, and the lead frame 28 and the heat radiating plate 16 are put on the package outer frame member 12.

The lead frame 28 includes an annular rectangular frame having a first pair of opposite frame portions 28a and 28b, and a second pair of opposite frame portions 28c and 28d. The lead frame 28 includes outer leads 14 extending inwardly from the first pair of frame portions 28a and 28b, and positioning dummy leads 30 extending inwardly from the second pair of frame portions 28c and 28d. The positioning dummy leads 30 are arranged oppositely on either side of the heat radiating plate 16. The outer leads 14, the positioning dummy leads 30, and the heat radiating plate 16 are arranged in a common plane.

In FIG. 1, the first metallized pattern 22 of the package outer frame member 12 is located on the outer peripheral region of the lower surface of the package outer frame member 12, and the inner ends of the outer leads 14 are put on the first metallized pattern 22. The second metallized pattern 24 is located on the inner peripheral region of the lower surface of the package outer frame member 12, and the heat radiating plate 16 is put on the second metallized pattern 24. Therefore, although the first metallized pattern 22 is separated from the second metallized pattern 24, the outer leads 14 and the heat radiating plate 16 are electrically coupled together by the positioning dummy leads 30 and the frame portions 28a, 28b, 28c, and 28d.

The inner ends of the positioning dummy leads 30 are arranged such that there are small clearances between the inner ends of the positioning dummy leads 30 and the outer edges of the heat radiating plate 16, respectively, for regulating the position of the heat radiating plate 16. In the embodiment, the gap between the positioning dummy lead 30 and the heat radiating plate 16 is 0.2 mm. That is, the size of the heat radiating plate 16 is 3.5 mm, and the distance between the inner ends of the positioning dummy leads 30 is 3.7 mm.

The outer leads 14 are made from 42 alloy (iron-nickel alloy) and have a thickness of 0.15 mm. The metallized patterns 22 and 24 are made from molybdenum and are plated with nickel. The heat radiating plate 16 is made from a copper plate having a thickness of 0.15 mm.

Silver solder (silver-copper alloy) is inserted between the outer leads 14 and the first metallized pattern 22, and between the heat radiating plate 16 and the second metallized pattern 24. The package outer frame member 12 with the lead frame 28 and the heat radiating plate 16 is inserted in a heating furnace at the temperature of 800° C. Silver solder is thus molten, and the lead frame 28 and the heat radiating plate 16 are soldered to the package outer frame member 12. The melting point of silver solder is high, so it is desirable to make the outer leads 14 from iron-nickel alloy to provide a sufficient strength. On the other hand, it is preferable to make the heat radiating plate 16 from a more thermally conductive metal selected from the group consisting of copper, copper alloy, tungsten and molybdenum. As a result, the heat radiating plate 16 is not secured by any other elements during the soldering process, and can freely move. Therefore, there is a problem of in which the position of the heat radiating plate 16 can be displaced.

According to the present invention, since the positioning dummy leads 30 are integrally formed with the frame 28, the movement of the heat radiating plate 16 is regulated during the soldering process, so the heat radiating plate 16 can be soldered in place to the package outer frame member 12. In the case where the positioning dummy leads 30 are not provided and the heat radiating plate 16 can freely move, it has been observed that the heat radiating plate 16 can move approximately 0.5 mm. The heat radiating plate 16 moves not only linearly, but also it rotates. According to the present invention, it is possible to attach the heat radiating plate 16 to the package outer frame member 12 with a positional accuracy with said gap of 0.2 mm at which there is no practical problem.

After the lead frame 28 and the heat radiating plate 16 are attached to the package outer frame member 12, the assembly is plated. The plating is applied only to the metal components. In this case, nickel plating and gold plating are carried out, using the lead frame 28 as an electrode. The heat radiating plate 16 can be plated, since the heat radiating plate 16 is electrically connected to the outer leads 14 via the second metallized pattern 24, the positioning dummy leads 30, and the frame portions 28a, 28b, 28c and 28d. In addition, the top surface of the upper outer frame member 12b can be plated, since the third metallized pattern is provided to extend from the second metallized pattern 24, through the side of the lower outer frame member 12a and the upper outer frame member 12b, to the top surface of the upper outer frame member 12b, as described above.

Thereafter, the semiconductor chip 18 can be mounted to the heat radiating plate 16 by die-bonding, and the cap 20 can be fixed to the package outer frame member 12. The positioning dummy leads 30 are cut and separated from the second pair of frame portions 28c and 28d, at an appropriate time after the plating process. It is needless to say that the outer leads 14 are cut and separated from the first pair of frame portions 28a and 28b.

Figure 2:
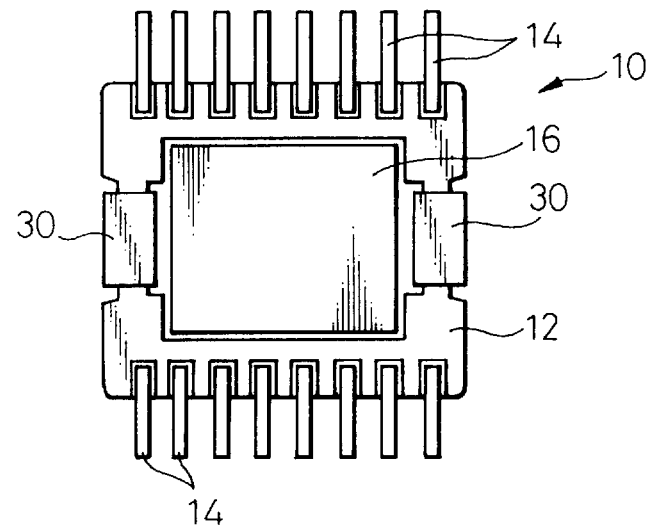
FIG. 2 is a bottom plan view of semiconductor device of FIG. 1, after the lead frame of FIG. 1 is cut.

FIG. 2 shows the bottom of the semiconductor device 10 after the positioning dummy leads 30 and the outer leads 14 are cut from the lead frame 28. A portion of the positioning dummy leads 30 remains in the semiconductor device 10 even after the cutting.

Figure 5:
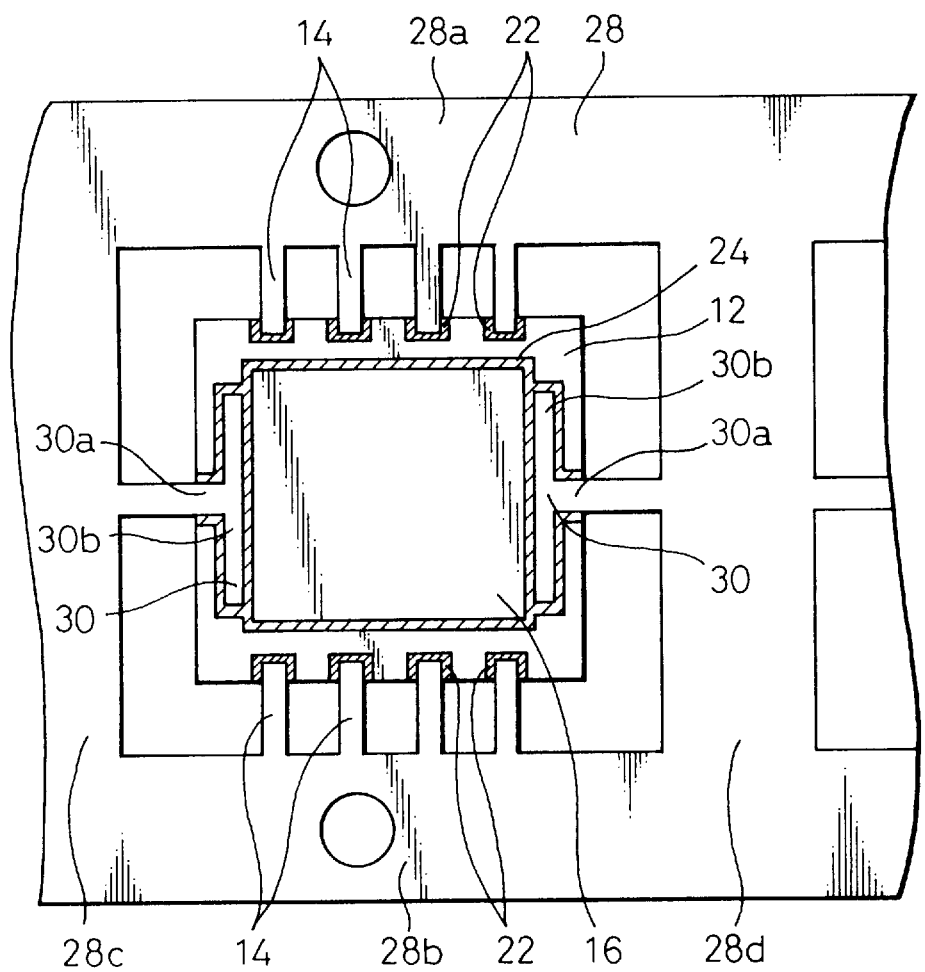
FIG. 5 is a bottom plan view of a semiconductor device and a lead frame according to another example of the present invention.

FIG. 5 shows the semiconductor device and the lead frame according to another example of the present invention. In this example, two positioning dummy leads 30 are arranged oppositely on either side of the heat radiating plate 16. Each of two positioning dummy leads 30 has a first portion 30a located at an outer peripheral region of the package outer frame member 12 and a second portion 30b facing the heat radiating plate 16. The second portion 30b extends generally along a side of the heat radiating plate 16 and is larger than the first portion 30a. By this arrangement, the positioning dummy leads 30 can more reliably regulate the position of the heat radiating plate 16. The other features are similar to those of the previous example.

Figure 6:
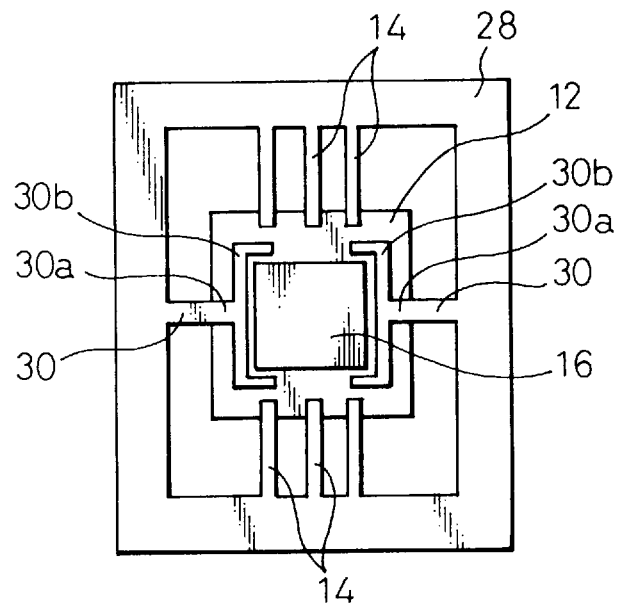
FIG. 6 is a bottom plan view of a semiconductor device and a lead frame according to a further example of the present invention.

FIG. 6 shows the semiconductor device and the lead frame according to a further example of the present invention. In this example, similar to that of FIG. 5, two positioning dummy leads 30 are arranged oppositely on either side of the heat radiating plate 16, and each of two positioning dummy leads 30 has a first portion 30a located at an outer peripheral region of the package outer frame member 12 and a second portion 30b facing the heat radiating plate 16. The second portion 30b is greater than the first portion 30a.

In FIG. 6, the second portion 30b of each of the two positioning dummy leads 30 extends generally along a side of the heat radiating plate 16 that faces the second portion 30b and is longer than the side of the heat radiating plate 16. The second portion 30b is bent around the corner of the heat radiating plate 16. By this arrangement, the positioning dummy leads 30 can more reliably regulate the position of the heat radiating plate 16. The other features are similar to those of the previous example. The metallized patterns of the package outer frame member 12 is deleted in FIG. 6.

Figure 7:
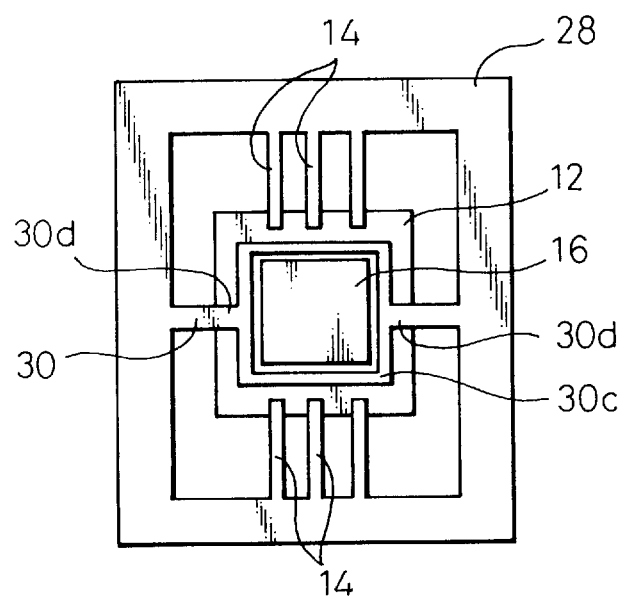
FIG. 7 is a bottom plan view of a semiconductor device and a lead frame according to a further example of the present invention.

FIG. 7 shows the semiconductor device and the lead frame according to a further example of the present invention. In this example, the positioning dummy lead 30 comprises an annular portion 30c surrounding the heat radiating plate 16, and two linear portions 30d extending from the annular portion 30c toward an outer peripheral region of the heat radiating plate 16. By this arrangement, the positioning dummy leads 30 can more reliably regulate the position of the heat radiating plate 16. The other features are similar to those of the previous example. The metallized patterns of the package outer frame member 12 are omitted in FIG. 7.

Figure 8:
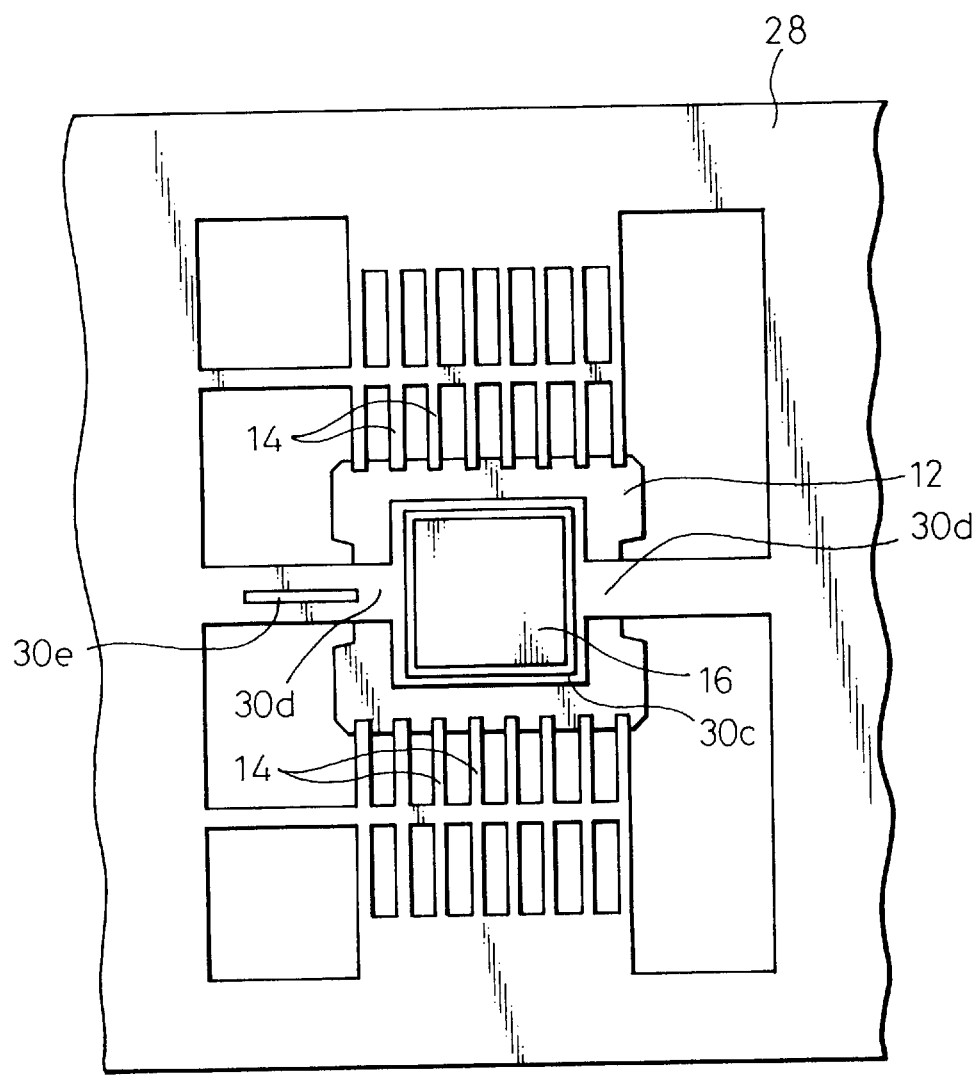
FIG. 8 is a bottom plan view of a semiconductor device and a lead frame according to a further example of the present invention.
Figure 9:
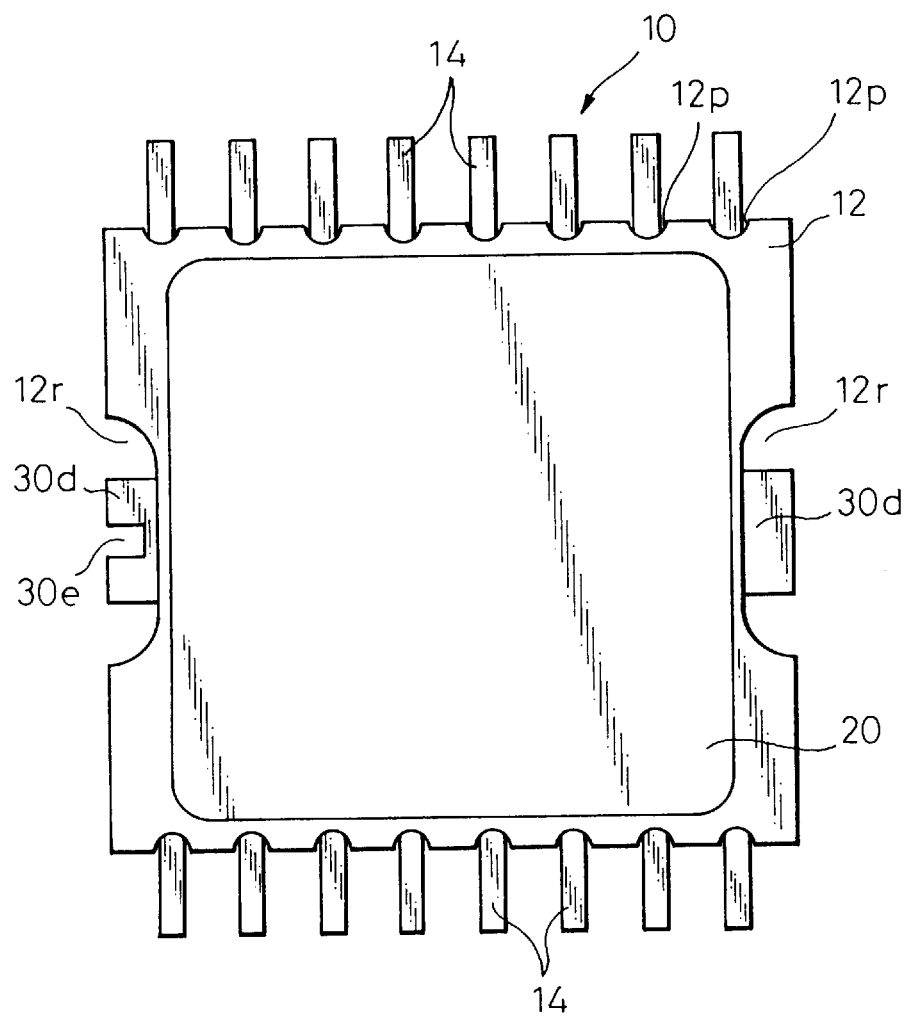
FIG. 9 is a plan view of the semiconductor device of FIG. 8 after the lead frame is cut.

FIGS. 8 and 9 show the semiconductor device and the lead frame according to a further example of the present invention. In this example, similar to the example of FIG. 7, the positioning dummy lead 30 comprises an annular portion 30c surrounding the heat radiating plate 16, and two linear portions 30d extending from the annular portion 30c toward an outer peripheral region of the heat radiating plate 16. In addition, in this example, the shape of one linear portion 30d is different from that of the other linear portion 30d. That is, a slit 30e is provided in one linear portion 30d.

FIG. 9 is a plan view of the semiconductor device of FIG. 8 in the completed form, and the cap 20 can be seen. Grooves 12r are provided in the opposite side of the package outer frame member 12, whereby the linear portions 30d of the positioning dummy lead 30 can be cut at positions flush with the side surfaces of the package outer frame member 12. The linear portions 30d of the positioning dummy lead 30, and in particular, the slit 30e, can be seen through grooves 12r. The slit 30e can act as an index regarding the disposition of the outer leads 14, so that the first pin can be recognized within the outer leads 14 with reference to the slit 30e in one of the linear portions 30d. In addition, grooves 12p are provided in the other pair of the side surfaces perpendicular to the side surfaces having grooves 12r. Grooves similar to the grooves 12p and 12r are also shown in FIGS. 1 and 2.

Figure 10:
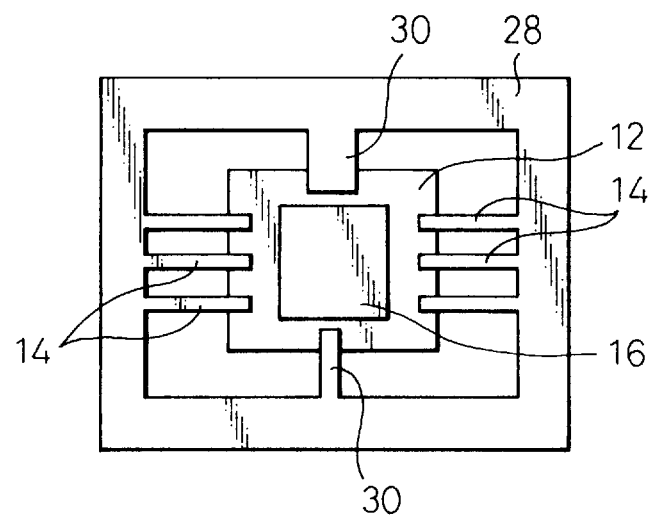
FIG. 10 is a bottom plan view of a semiconductor device and a lead frame according to a further example of the present invention.

FIG. 10 shows the semiconductor device and the lead frame according to a further example of the present invention. In this example, two positioning dummy leads 30 are arranged oppositely on either side of the heat radiating plate 16, and one of the positioning dummy leads 30 has a greater size than that of the other positioning dummy lead 30. By this arrangement, the greater positioning dummy lead 30, for example, can act as an index regarding the disposition of the outer leads 14, so that the first pin can be recognized within the outer leads 14.

Figure 11:
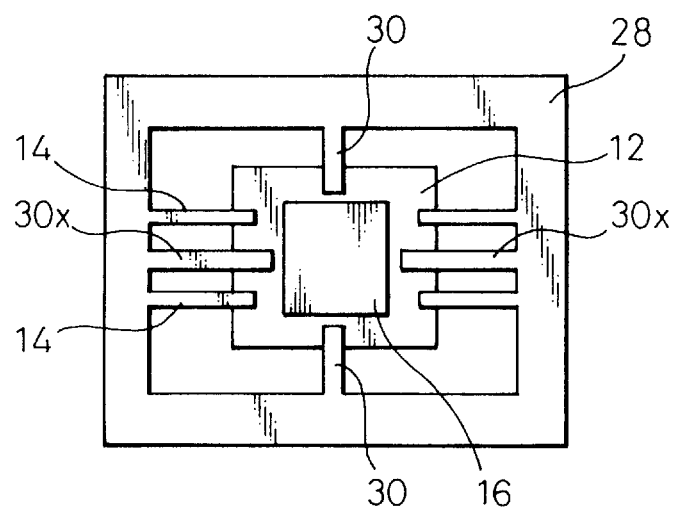
FIG. 11 is a bottom plan view of a semiconductor device and a lead frame according to a further example of the present invention.

FIG. 11 shows the semiconductor device and the lead frame according to a further example of the present invention. In this example, two positioning dummy leads 30 are arranged oppositely on either side of the heat radiating plate 16 along a first line (for example, a vertical line in FIG. 11), and a second pair of positioning dummy leads 30x are arranged oppositely on either side of the heat radiating plate 16 along a second line perpendicular to the first line (for example, a horizontal line in FIG. 11). In this manner, the position of the positioning dummy leads 30 is not limited only to the sides of the lead frame 28 at which the outer leads 14 are not provided.

Figure 12:
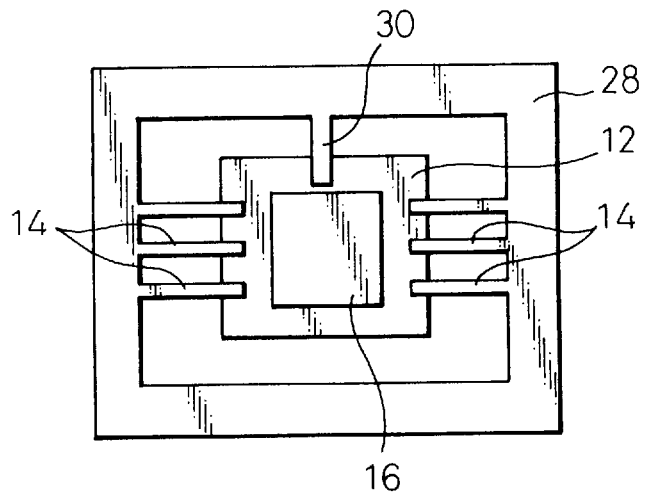
FIG. 12 is a bottom plan view of a semiconductor device and a lead frame according to a further example of the present invention.

FIG. 12 shows the semiconductor device and the lead frame according to a further example of the present invention. In this example, a single positioning dummy lead 30 is arranged to regulate the position of the heat radiating plate 16. Since the heat radiating plate 16 moves linearly or rotationally during the soldering process, as described above, the single positioning dummy lead 30 can regulate the position of the heat radiating plate 16 to some extent.

Figure 13:
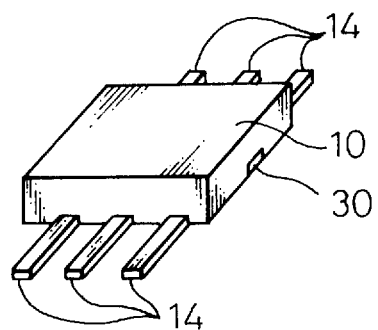
FIG. 13 is a perspective view of a semiconductor device according to the embodiment of the present invention.
Figure 14:
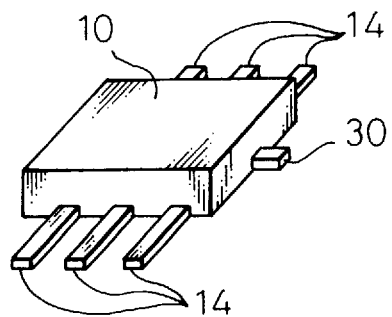
FIG. 14 is a perspective view of the semiconductor device of FIG. 13, viewed from the opposite side from that of FIG. 13.

FIGS. 12 and 13 show the semiconductor device according to a further example of the present invention. FIG. 12 is a view illustrating the semiconductor device from one side thereof, and FIG. 13 is a view illustrating the semiconductor device from the opposite side thereof. One of the positioning dummy leads 30 is cut at a plane flush with the one side surface of the semiconductor device (the package outer frame member 12), and the other positioning dummy lead 30 is cut at a plane on the slightly outside from the side surface of the semiconductor device (the package outer frame member 12). Therefore, in this case too, the positioning dummy lead 30 can be used as an index.

As explained above in greater detail, according to the present invention, it is possible to attach a heat radiating plate to a package outer frame member at an exact position, and thereafter, it is possible to easily carry out plating.

I claim:

1. A semiconductor device comprising:
   an insulating package outer frame member having an annular bottom surface with outer and inner peripheral regions, a first metallized pattern provided at least on the outer peripheral region of said bottom surface, and a second metallized pattern provided on the inner peripheral region of said bottom surface;
   outer leads connected to the first metallized pattern of the package outer frame member;
   a heat radiating plate arranged in the same plane as the outer leads and connected to the second metallized pattern of the package outer frame member;
   at least one positioning dummy lead made from a material different from that of the heat radiating plate and connected to the second metallized pattern of the package outer frame member to regulate the position of the heat radiating plate; and
   a semiconductor chip mounted to the heat radiating plate within the package outer frame member.

2. A semiconductor device according to claim 1, wherein said at least one positioning dummy lead is made from a material identical to that of the outer leads, and arranged in the same plane as that of the outer leads and separated from the outer leads.

3. A semiconductor device according to claim 2, wherein the outer leads are made from iron-nickel alloy, said heat radiating plate is made from metal selected from the group consisting of copper, copper alloy, tungsten and molybdenum, and said outer leads, said at least one positioning dummy lead and said heat radiating plate are plated by a common plating material.

4. A semiconductor device according to claim 1, wherein said at least one positioning dummy lead is arranged such that a small clearance exists between said at least one positioning dummy lead and said heat radiating plate.

5. A semiconductor device according to claim 1, wherein said at least one positioning dummy lead comprises two positioning dummy leads arranged oppositely on either side of said heat radiating plate.

6. A semiconductor device according to claim 5, wherein said two positioning dummy leads are arranged at a distance between them, and said heat radiating plate has a size, the distance between said two positioning dummy leads being slightly greater than the size of said heat radiating plate, whereby a small clearance exists between at least one of said positioning dummy leads and said heat radiating plate.

7. A semiconductor device according to claim 5, wherein one of said two positioning dummy leads has a different size from the other of said two positioning dummy leads.

8. A semiconductor device according to claim 1, wherein said at least one positioning dummy lead comprises two positioning dummy leads arranged oppositely on either side of said heat radiating plate, each of said two positioning dummy leads having a first portion located at the outer peripheral region of said package outer frame member and a second portion facing said heat radiating plate, said second portion being greater than said first portion.

9. A semiconductor device according to claim 8, wherein said second portion of each of said two positioning dummy leads is longer than a side of said heat radiating plate that faces said second portion and bent around corners of said heat radiating plate.

10. A semiconductor device according to claim 1, wherein said at least one positioning dummy lead comprises a first pair of positioning dummy leads arranged oppositely on either side of said heat radiating plate along a first line, and a second pair of positioning dummy leads arranged oppositely on either side of said heat radiating plate along a second line perpendicular to said first line.

11. A semiconductor device according to claim 1, wherein said at least one positioning dummy lead comprises an annular portion surrounding said heat radiating plate, and two linear portions extending from said annular portion toward an outer peripheral region of said heat radiating plate.

12. A semiconductor device according to claim 11, wherein one of said two linear portions has a different shape from the other of said two linear portions.

13. A semiconductor device according to claim 1, wherein a groove is provided in a side surface of the package outer frame member, whereby said at least one positioning dummy lead can be cut at a position flush with the side surface of the package outer frame member and said at least one positioning dummy lead can be seen through the groove.

14. A lead frame mounted to a semiconductor device including a package outer frame member, a heat radiating plate and a semiconductor chip, said lead frame comprising:
an annular rectangular frame having a first pair of frame portions and a second pair of frame portions;
outer leads extending inwardly from said first pair of frame portions;
at least one positioning dummy lead extending inwardly from at least one of said second pair of frame portions;
said at least one positioning dummy lead being arranged such that said at least one positioning dummy lead regulates the position of the heat radiating plate while the heat radiating plate is being attached to the package outer frame member and is separated from said at least one of said second pair of frame portions after the heat radiating plate is attached to the package outer frame member.

15. A lead frame according to claim 14, wherein said at least one positioning dummy lead is arranged such that a small clearance exists between said at least one positioning dummy lead and said heat radiating plate.

16. A lead frame according to claim 14, wherein said at least one positioning dummy lead comprises two positioning dummy leads extending inwardly from both said second pair of frame portions.

17. A lead frame according to claim 16, wherein one of said two positioning dummy leads has a different size from the other of said two positioning dummy leads.

18. A lead frame according to claim 14, wherein said package outer frame member has an inner peripheral region and an outer peripheral region, said at least one positioning dummy lead comprises two positioning dummy leads arranged oppositely on either side of said heat radiating plate, each of said two positioning dummy leads having a first portion located at the outer peripheral region of said package outer frame member and a second portion facing said heat radiating plate, said second portion being greater than said first portion.

19. A lead frame according to claim 18, wherein said second portion of each of said two positioning dummy leads is longer than a side of said heat radiating plate that faces said second portion and bent around corners of said heat radiating plate.

20. A lead frame according to claim 14, wherein said at least one positioning dummy lead comprises a first pair of positioning dummy leads arranged oppositely on either side of said heat radiating plate along a first line, and a second pair of positioning dummy leads arranged oppositely on either side of said heat radiating plate along a second line perpendicular to said first line.

21. A lead frame according to claim 14, wherein said at least one positioning dummy lead comprises an annular portion surrounding said heat radiating plate, and two linear portions extending from said annular portion toward an outer peripheral region of said heat radiating plate.

22. A lead frame according to claim 21, wherein one of said two linear portions has a different shape from the other of said two linear portions.

* * * * *